US012757411B2

(12) United States Patent
Du et al.

(10) Patent No.: US 12,757,411 B2
(45) Date of Patent: Oct. 6, 2026

(54) NON-VOLATILE MEMORY DEVICE HAVING PRIMARY MEMORY LAYER WITH OXYGEN GRADIENT

(71) Applicant: NANYANG TECHNOLOGICAL UNIVERSITY, Singapore (SG)

(72) Inventors: Yuanmin Du, Singapore (SG); Wen Siang Lew, Singapore (SG); Putu Andhita Dananjaya, Singapore (SG); Siew Wei Hoo, Singapore (SG); Weng Hong Lai, Singapore (SG)

(73) Assignee: Nanyang Technological University, Singapore (SG)

( * ) Notice: Subject to any disclaimer, the term of this patent is extended or adjusted under 35 U.S.C. 154(b) by 341 days.

(21) Appl. No.: 18/562,739

(22) PCT Filed: Jun. 8, 2022

(86) PCT No.: PCT/SG2022/050389
§ 371 (c)(1),
(2) Date: Nov. 20, 2023

(87) PCT Pub. No.: WO2022/260595
PCT Pub. Date: Dec. 15, 2022

(65) Prior Publication Data

US 2024/0268126 A1 Aug. 8, 2024

(30) Foreign Application Priority Data

Jun. 8, 2021 (SG) ........................... 10202106132V

(51) Int. Cl.
*H10B 63/00* (2023.01)
*H10N 70/00* (2023.01)
(Continued)

(52) U.S. Cl.
CPC ......... *H10B 63/20* (2023.02); *H10P 14/3434* (2026.01)

(58) Field of Classification Search
CPC ..... H10B 63/20; H10P 14/3434; G11C 29/06; G11C 29/50008; G11C 29/50016;
(Continued)

(56) References Cited

U.S. PATENT DOCUMENTS 8,288,809 B2 10/2012 Ahn et al.
8,759,806 B2 6/2014 Yamaguchi et al.
(Continued)

FOREIGN PATENT DOCUMENTS

CN 112909159 A 6/2021
KR 10-2012-0032909 A 4/2012
WO 2018/044256 A1 3/2018

OTHER PUBLICATIONS

Chen et al., "Highly Uniform Bipolar Resistive Switching With Al2O3 Buffer Layer in Robust NbAlO-Based RRAM," IEEE Electron Device Letters, vol. 31, No. 4, pp. 356-358, 2010.
(Continued)

*Primary Examiner* — Herve-Louis Y Assouman
(74) *Attorney, Agent, or Firm* — Cesari and McKenna, LLP; Steven M. Mills

(57) ABSTRACT

Provided is an electrically actuated resistive non-volatile memory. The resistive memory device comprises a first electrode, a second electrode, a buffer layer, and a primary memory layer. The primary memory layer comprises a first active layer, a second active layer, and a third active layer, wherein an oxygen gradient is configured across the primary memory layer. Methods of fabricating and operating such a memory device are also provided. The memory device advantageously provides for lower power consumption and more stable resistive switching.

19 Claims, 10 Drawing Sheets

(51) Int. Cl.
*H10N 70/20* (2023.01)
*H10P 14/20* (2026.01)

(58) Field of Classification Search
CPC ........... G11C 2213/55; G11C 13/0007; H10N 70/026; H10N 70/24; H10N 70/826; H10N 70/8833
See application file for complete search history.

(56) References Cited

U.S. PATENT DOCUMENTS

| | | | | |
|---|---|---|---|---|
| 8,822,265 | B2 | 9/2014 | Phatak et al. | |
| 2012/0012807 | A1* | 1/2012 | Yamaguchi ............ | H10N 70/24 257/4 |
| 2012/0049145 | A1* | 3/2012 | Lee ........................ | H10N 70/24 257/3 |
| 2019/0042967 | A1 | 2/2019 | Yoscovits et al. | |
| 2021/0175418 | A1* | 6/2021 | Hsu .................... | H10N 70/8416 |

OTHER PUBLICATIONS

Choi et al., "Resistive switching mechanism of TiO2 thin films grown by atomic-layer deposition," Journal of Applied Physics, vol. 98, pp. 1-10, 2005.

Feng et al., "Resistive Switches in Ta20S-a/Ta02-x Bilayer and Ta20S-a/Ta02-x/Ta02-y Tri-layer Structures," 14th Annual Non-Volatile Memory Technology Symposium (NVMTS), pp. 1-4, 2015.

Lee et al., "A fast, high-endurance and scalable non-volatile memory device made from asymmetric Ta2O5-x/TaO2-x bilayer structures," Nature Materials, vol. 10, pp. 625-630, 2011.

Lin et al., "Multi-Level Switching of Al-Doped HfO2 RRAM with a Single Voltage Amplitude Set Pulse," Electronics, vol. 10, No. 731, pp. 1-10, 2021.

* cited by examiner

NON-VOLATILE MEMORY DEVICE HAVING PRIMARY MEMORY LAYER WITH OXYGEN GRADIENT

CROSS-REFERENCE TO RELATED APPLICATIONS

The present application is a National Stage Application, filed under 35 U.S.C. § 371, of International Application No. PCT/SG2022/050389, filed Jun. 8, 2022, which claims the benefit of priority of Singapore patent application Ser. No. 10/202,106132V, filed Jun. 8, 2021, the entire contents of which are incorporated herein by reference.

TECHNICAL FIELD

The present disclosure relates to the field of non-volatile memories, and more particularly to resistive random-access memories and methods of fabricating the same.

BACKGROUND

Resistive random-access memories (RRAM) store data based on a change in the electrical resistance of a main switching layer. When a voltage greater than or equal to a set voltage is applied to a RRAM device, the resistance in the main switching layer changes from an "OFF" state to an "ON" state. When a voltage greater than or equal to a reset voltage is applied, the resistance in the main switching layer changes from an "ON" state to an "OFF" state. Such devices are useful in many applications, for example, in logic circuits, as memory components, and for communication between logic devices and memory devices, etc. Conventional resistive non-volatile memories suffer from large power consumption and unstable resistive switching problems. Having a buffer layer between the electrodes and the main switching layer leads to performance issues such as increased power consumption. As such, there remains a need for an approach to form devices by developing a structure which meets the high performances requirements.

SUMMARY

In one aspect, the present application discloses a non-volatile memory device, including: a buffer layer of a first metal oxide; and a primary memory layer having: a first active layer of a second metal oxide, the first active layer being immediately adjacent and connected to the buffer layer; a second active layer of a third metal oxide; and a third active layer, the second active layer being disposed between the first active layer and the third active layer, wherein the primary memory layer is characterized by an oxygen gradient, and wherein a highest oxygen concentration is associated with the first active layer, and wherein a lowest oxygen concentration is associated with the third active layer.

The first active layer, the second active layer, and a third active layer may define a first interface and a second interface in the primary memory layer, wherein the second active layer is bounded by the first interface and the second interface.

The second active layer may be associated with an oxygen concentration lower than that associated with the first active layer and higher than that associated with the third active layer. Each of the first active layer, the second active layer, and the third active layer may be associated with a respective oxygen concentration.

Each of the first active layer, the second active layer, and the third active layer may be associated with a respective material composition. In some examples, each of the first active layer, the second active layer, and the third active layer may be associated with a respective uniform material composition. Each of the first active layer, the second active layer, and the third active layer may be associated with a respective work function, wherein the respective work function decreases from the first active layer to the second active layer, and wherein the respective work function decreases from the second active layer to the third active layer. The first metal oxide may be characterized by a stoichiometric or near stoichiometric composition. The first metal oxide may include one of $AlO_x$, $SiO_x$, $MgO_x$, $CaO_x$, $HfSiO_x$, or any combination thereof. The first metal oxide may have a band gap greater than that of the second metal oxide.

The second metal oxide may include one of Ta oxide, Hf oxide, Zr oxide, Ti oxide, La oxide, or any combination thereof, and wherein the second metal oxide is characterized by a stoichiometric or near stoichiometric composition. The third metal oxide may include one of Ta oxide, Hf oxide, Zr oxide, Ti oxide, La oxide, or any combination thereof. The second metal oxide and the third metal oxide may be of a same group, and the third metal oxide further comprises a first dopant, the first dopant being a metal different from any metal element forming the second metal oxide.

The third active layer may include a fourth metal oxide, wherein the fourth metal oxide includes one of Ta oxide, Hf oxide, Zr oxide, Ti oxide, La oxide, or any combination thereof. The third metal oxide and the fourth metal oxide may be of a same group, wherein the fourth metal oxide comprises a second dopant, the second dopant being a metal different from any metal element forming the second metal oxide. In some embodiments in which the third active layer comprises a fourth metal oxide, the fourth metal oxide is doped with a second dopant, the second dopant may be a metal that is same as the first dopant or, alternatively, the second dopant may be a metal that is different from the first dopant.

The third active layer may include an active metal, wherein the active metal may be selected from the group consisting of Ta, Ti, Hf, and Zr. Alternatively, the third active layer may include an active metal, wherein the active metal may be selected from the group consisting of Co, Ni, Fe, and an alloy of any two or more of Co, Ni, and Fe. Alternatively, the third active layer may include at least one magnetic element, an alloy of the at least one magnetic element, a compound of the at least one magnetic element, or any combination thereof.

The first metal oxide may be $Al_2O_3$, and the first active layer may comprise $Ta_2O_x$ in which $4.5 \leq x \leq 5$. The second active layer may comprise $TaO_y$ with $1 \leq y \leq 2.2$, and wherein the second active layer is doped with a first dopant, the first dopant being a metal different from any metal present in the first active layer. The first dopant may be at least one selected from the group consisting of: Al, Hf, Ti, Zr, Nb, and Ru. The third active layer may comprise $TaO_z$ in which $0 < z \leq 0.5$, and wherein the third active layer is doped with a second dopant, the second dopant being a metal different from any metal present in the first active layer. The second dopant may be at least one selected from the group consisting of: Al, Hf, Ti, Zr, Nb, and Ru. Alternatively, the third active layer may comprise an active metal, the active metal being Ta.

The non-volatile memory device may further include a first electrode layer and a second electrode layer, wherein the buffer layer and the primary memory layer are disposed between the first electrode layer and the second electrode layer. The first electrode layer may be formed of any one of the following: W, Al, Cu, Mo, Co, Ni, Fe, Pt, Pd, Au, Ir, Ru, Rh, TiN, TiW, and TaN. The second electrode layer may be formed of any of the following: Pt, Pd, Au, Ir, Ru, Rh, TiN, TaN, and TiW.

Each of the first active layer, the second active layer, and the third active layer may have a film thickness in a range from 1 nanometer to 10 nanometers. The buffer layer may have a film thickness in a range from 0.5 nanometer to 5 nanometers.

In another aspect, the present application discloses a non-volatile memory device, including: a first electrode layer; a second electrode layer; a buffer layer disposed between the first electrode and the second electrode; and a primary memory layer comprising three active layers disposed between the buffer layer and the second electrode, the first active layer is physically connected to the buffer layer and the third active layer is physically connected to the second electrode; wherein the first active layer has a high oxygen concentration, the second active layer has a lower oxygen concentration than the first active layer, and the third active layer has a lower oxygen concentration than the second active layer, an oxygen concentration decreasing in a direction from the first active layer to the third active layer.

Optionally, the first electrode is formed of one of a metal and a conductive nitride. Optionally, the first electrode includes at least one of W, Al, Cu, Mo, Co, Ni, Fe, Pt, Pd, Au, Ir, Ru, Rh, TiW, TiN and TaN. Optionally, the second electrode includes at least one of Pt, Pd, Au, Ir, Ru, Rh, TiW, TiN and TaN.

The buffer layer is formed of a first metal oxide. Preferably, the first metal oxide includes at least one of $AlO_x$, $SiO_x$, $MgO_x$, $CaO_x$, $HfSiO_x$, and a combination thereof.

The first active layer is formed of a second metal oxide. The second metal oxide includes one of Ta oxide, Hf oxide, Zr oxide, Ti oxide, La oxide, and a combination thereof. The first metal oxide has a band gap greater than the second metal oxide.

The second metal oxide may include $Ta_2O_x$, wherein $4.5 \le x \le 5$. The second active layer is formed of a third metal oxide. The oxygen concentration of the second active layer is lower than the oxygen concentration of the first active layer.

The third metal oxide may be formed of an oxide from the same group as the second metal oxide. The third metal oxide may be formed of an oxide from the same group as the second metal oxide and doped with a metal element different from the second metal oxide. The third metal oxide may include $TaO_y$, where $1 \le y \le 2.2$.

The third active layer may be formed of a fourth metal oxide or an active metal. The oxygen concentration of the third active layer is lower than the oxygen concentration of the second active layer. The fourth metal oxide may be formed of an oxide from the same group as the third metal oxide. The fourth metal oxide may be formed of an oxide from the same group as the third metal oxide and doped with a metal element different from the second metal oxide. The fourth metal oxide may include $TaO_z$, where $0 < z \le 0.5$. Alternatively, the third active layer may comprise an active metal. The active metal may include one of Ta, Ti, Hf, Zr, Co, Ni and Fe. The third active layer is disposed between the second active layer and the second electrode.

Each of the first active layer, the second active layer, and the third active layer may have a film thickness in a range from 1 nanometer to 10 nanometers. The buffer layer may have a film thickness in a range from 0.5 nanometer to 5 nanometers.

DETAILED DESCRIPTION

Reference throughout this specification to “one embodiment”, “another embodiment” or “an embodiment” (or the like) means that a particular feature, structure, or characteristic described in connection with the embodiment is included in at least one embodiment. Thus, the appearance of the phrases “in one embodiment” or “in an embodiment” or the like in various places throughout this specification are not necessarily all referring to the same embodiment. Furthermore, the described features, structures, or characteristics may be combined in any suitable manner in one or more embodiments. In the following description, numerous specific details are provided to give a thorough understanding of embodiments. One skilled in the relevant art will recognize, that the various embodiments be practiced without one or more of the specific details, or with other methods, components, materials, etc. In other instances, some or all known structures, materials, or operations may not be shown or described in detail to avoid obfuscation.

The word “exemplary” is used herein to mean “serving as an example, instance, or illustration.” Any embodiment described herein as “exemplary” is not necessarily to be construed as preferred or advantageous over other embodiments. As used herein, the singular 'a' and 'an' may be construed as including the plural "one or more" unless apparent from the context to be otherwise.

Terms such as "first" and "second" are used in the description and claims only for the sake of brevity and clarity, and do not necessarily imply a priority or order, unless required by the context. The terms "about" and "approximately" as applied to a stated numeric value encompasses the exact value and a reasonable variance as will be understood by one of ordinary skill in the art, and the terms "generally" and "substantially" are to be understood in a similar manner, unless otherwise specified.

Figure 1:
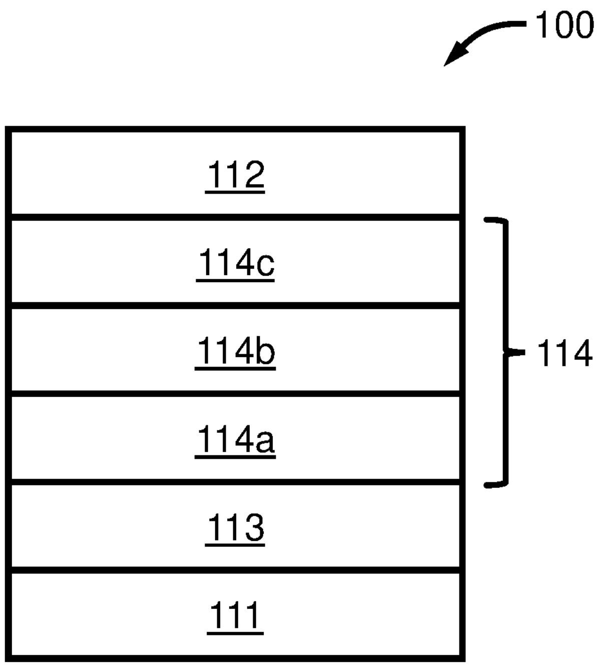
FIG. 1 is a cross-sectional view of a schematic representation of a non-volatile memory device according to an exemplary embodiment of the present disclosure.

FIG. 1 is a cross-sectional view illustrating a non-volatile memory device 100 according to an exemplary embodiment of the present disclosure. The term "non-volatile memory (NVM) device" refers to computer-accessible memory devices in which stored data can be retained even when the device is not powered on. Non-volatile memory devices in which embodiments of the present disclosure are applicable include, but are not limited to, resistive random-access memory (ReRAM) devices, phase-change random-access memory (PRAM), magnetic random-access memory (MRAM), voltage-controlled magnetic anisotropy (VCMA) devices, ferroelectric random-access memory (FRAM), flash memory devices, read-only memories (ROM), erasable programmable read-only memories (EPROM), electrically erasable programmable read-only memories (EEPROM), etc. The device 100 includes a buffer layer 113 and a primary memory layer 114. The buffer layer 113 and the primary memory layer 114 are disposed between a first electrode layer 111 and a second electrode layer 112. The primary memory layer 114 is configured with a multiple layer structure. The primary memory layer 114 includes a first active layer 114*a*, a second active layer 114*b*, and a third active layer 114*c*.

Figure 2:
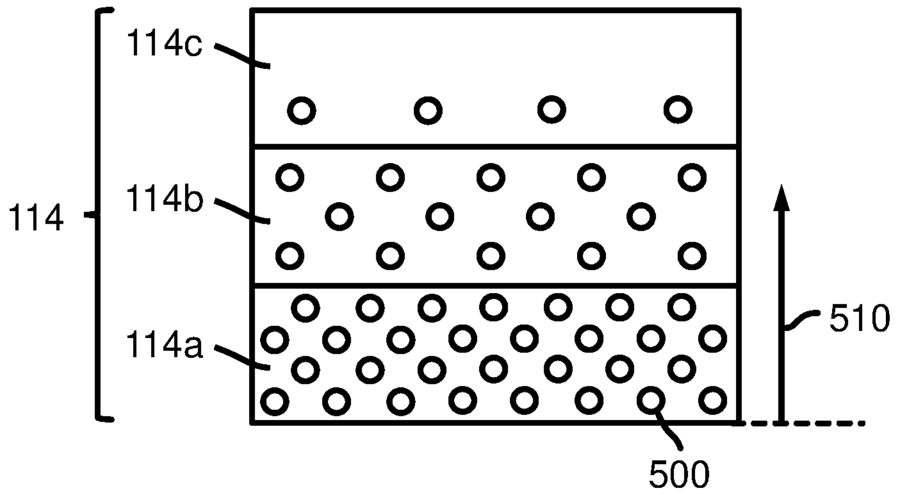
FIG. 2 is a schematic illustration of an exemplary oxygen ion distribution across a primary memory layer according to the embodiment of FIG. 1.

Referring to FIG. 2, the primary memory layer 114 contains multiple layers. The primary memory layer 114 is characterized by an oxygen concentration that decreases from the first active layer 114*a* to the second active layer 114*b*, and from the second active layer 114 to the third active layer 114*c* (oxygen ions 500). An oxygen gradient 530 is formed within the primary memory layer 114. The energy barrier to the migration of oxygen ions/vacancies between different active layers (e.g., between the first active layer 114*a* and the second active layer 114*b*, and/or between the second active layer 114*b* and the third active layer 114*c*) can be modulated by configuring the memory device 100 with an oxygen gradient 530 across the active layers 114*a*, 114*b*, 114*c*.

The first active layer 114*a* is formed of a second metal oxide. The second metal oxide includes one of the following: a tantalum (Ta) oxide, a hafnium (Hf) oxide, a zirconium (Zr) oxide, a titanium (Ti) oxide, a lanthanum (La) oxide, and a combination of any one or more thereof.

The first active layer 114*a* may have a stoichiometric composition or a composition close to a stoichiometric composition. For example, the first active layer may be formed of a Ta oxide such as $Ta_2O_5$ or a Ta oxide having a composition substantially close to $Ta_2O_5$. For example, the first active layer 114*a* may include $Ta_2O_x$, where $4.5 \le x \le 5$. In this example the second active layer 114*b* may be formed by $TaO_x$, where $1 \le x \le 2.2$; and the third active layer 114*c* may be formed by Ta or $TaO_y$, wherein $0<y<x$, and $0 \le y \le 0.5$. The respective compositions of each of the active layers 114*a*, 114*b*, 114*c* are selected such that the work function of the third active layer 114*c* is smaller than the second active layer 114*b*, and the work function of the second active layer 114*b* is smaller than the first active layer 114*a*.

The second active layer 114*b* is formed of a third metal oxide. The second active layer 114*b* may be from the same oxide group as the first active layer 114*a*. For example, when the first active layer 114*a* is formed of a tantalum oxide $Ta_2O_5$, the second active layer 114*b* may be a tantalum oxide of a different composition $TaO_x$, i.e., the first active layer 114*a* and the second active layer 114*b* are from the same oxide group of tantalum oxides. Alternatively, the second active layer 114*b* may be from the same metal group of the first active layer 114*a*, but doped with a metal element different from the first active layer 114*a*. In a specific example, when the first active layer 114*a* is formed of $Ta_2O_5$, the second active layer 114*b* may be $TaO_x$ doped with a different element such as Hf, Zr, Ti, and so on, and a different metal oxide other than a Ta oxide may be formed. The diffusivity of oxygen ions or vacancies of the second active layer 114*b* may be greater than that of the first active layer 114*a*.

The third active layer 114*c* may be formed of a fourth metal oxide or an active metal. Compared to the first active layer 114*a* and the second active layer 114*b*, the third active layer 114*c* has a much lower oxygen concentration. The third active layer may enhance an ohmic contact between the second active layer 114*b* and the second electrode 112. In one example, when a Ta oxide is used for the second active layer 114*b*, the third active layer 114*c* may be Ta. Other metals such as Ti, Hf, Zr, Co, Ni and Fe, may be used as the active metal for the active layer 114*c*. Due to the interface reaction and/or atomic migration, a region composing of oxygen ions 500 may exist between the second active layer 114*b* and the third active layer 114*c*, as illustrated by the exemplary embodiment shown in FIG. 2.

The third active layer 114*c* may be from the same oxide group as the second active layer 114*b*. For example, when the second active layer 114*b* is formed of $TaO_x$, the third active layer 114*c* may be $TaO_y$, from the same oxide group. Alternatively, the third active layer 114*c* may be formed of an oxide from the same group of the second active layer 114*b*, but doped with a metal element different from the second active layer 114*b*. In one example, when the second active layer 114*b* is formed of $TaO_x$, the third active layer 114*c* may be $TaO_y$ doped with a different element such as Hf, Zr, Ti, and so on, and a different metal oxide other than a Ta oxide may be formed. The oxygen diffusivity of the third active layer 114*c* may be greater than that of the second active layer 114*b*.

With the application of a forming voltage, an electroforming process may be performed on the memory device 100. The electroforming process may be performed by applying a voltage to the second electrode layer 112, with the first electrode layer 111 being grounded. When the current increases to a limit or the compliance current value, the corresponding voltage value applied is defined as the forming voltage. Through the electroforming process, conductive paths, such as metal filaments or bridges, are formed across the buffer layer 113 and the primary memory layer 114, and the electrical resistance of the device is switched from an initial high resistance state (IRS) to a low resistance state (LRS). The metal filaments may be formed from oxygen vacancies or metal atom chains.

Figure 3A:
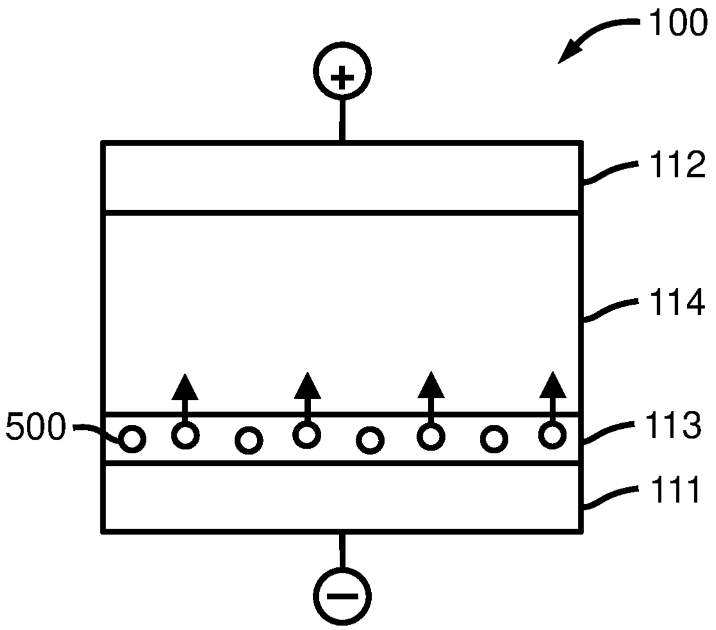
FIGS. 3A and 3B schematically illustrate exemplary operational mechanisms of the non-volatile memory device of FIG. 1.
Figure 3B:
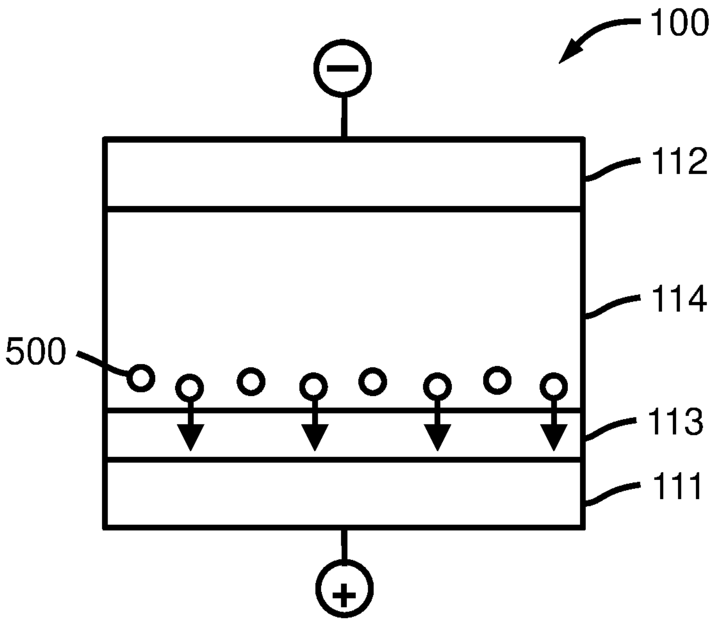

Referring to FIGS. 3A and 3B, an exchange of oxygen ions 500 between the buffer layer 113 and the primary memory layer 114 takes places when a voltage is applied between the electrode layers 111 and 112. As illustrated in FIG. 3A, when a positive voltage is applied on the second electrode layer 112, oxygen ions 500 move from the buffer layer 113 to the primary memory layer 114, and an oxidation process takes place at the primary memory layer 114. The electrical resistance of the device changes from a low resistance state (LRS, an ON-state) to a high resistance state (HRS, an OFF-state). The voltage value applied to switch the device from an ON-state to an OFF-state is defined as the reset voltage. As illustrated in FIG. 3B, when a negative voltage is applied on the second electrode layer 112, oxygen ions 500 move from the primary memory layer 114 to the buffer layer 113, and a reduction process takes place at the primary memory layer 114, resulting the electrical resistance of the device changing from an OFF-state to an ON-state. The voltage value applied to switch from an OFF-state to an ON-state is defined as the set voltage.

The buffer layer 113 disposed between one of the electrode layers 111/112 and the primary memory layer 114 may be configured with a much larger band gap than the first active layer 114*a*. In one example, when a Ta oxide is used for the first active layer 114*a*, the material used for the buffer layer 113 may be one of $AlO_x$, $SiO_x$, $MgO_x$, $CaO_x$, $HfSiO_x$, a combination thereof, or the like. The buffer layer is configured to increase a potential barrier between the electrode and the primary memory layer.

The buffer layer 113 may have a stoichiometric composition or a composition close to a stoichiometric composition. For example, the buffer layer may be formed of Al oxide such as $Al_2O_3$ or may have a composition substantially close to $Al_2O_3$, and thus may be more stable than the first active layer 114*a*. The buffer layer 113 material may have an interatomic bonding energy greater than that of the first active layer 114*a*. The buffer layer 113 may function to improve reliability and stability of the resistance change characteristic of the memory device 100. When the buffer layer 113 is not formed, the direct contact of the first electrode layer 111 with the primary memory layer 114 may lead to interface reactions, and result in an undesirable material that may deteriorate the resistive switching characteristics of the memory device. The buffer layer 113 may prevent metal ions (derived from the first electrode layer 111) from entering the primary memory layer 114, and thus the durability of the memory device may be enhanced.

The first electrode layer 111 may be formed of a metal or a conductive nitride. Examples of materials suitable for the first electrode layer 111 include W, Al, Cu, Mo, Co, Ni, Fe, Pt, Pd, Au, Ir, Ru, Rh, TiN, TiW, TaN and/or other materials known in the art.

The second electrode layer 112 may be formed of a chemically noble metal or a conductive nitride which is oxidation resistant. For example, the second electrode layer 112 includes at least one of Pt, Pd, Au, Ir, Ru, Rh, TiN, TaN, TiW, and/or other materials known in the art.

In one embodiment illustrated in FIG. 1, the memory device 100 comprises a first electrode layer 111, a buffer layer 113, a primary memory layer 114, and a second electrode layer 112. Described in a bottom-up sequence, the first electrode layer 111 is a bottom electrode and the second electrode layer 112 is a top electrode. It will be understood that the elements and principles described are also applicable to cases where the first electrode layer 111 is a top electrode and the second electrode layer 112 is a bottom electrode. In other words, the non-volatile memory device 100 may be otherwise oriented without departing from the teaching of present disclosure.

Figure 4:
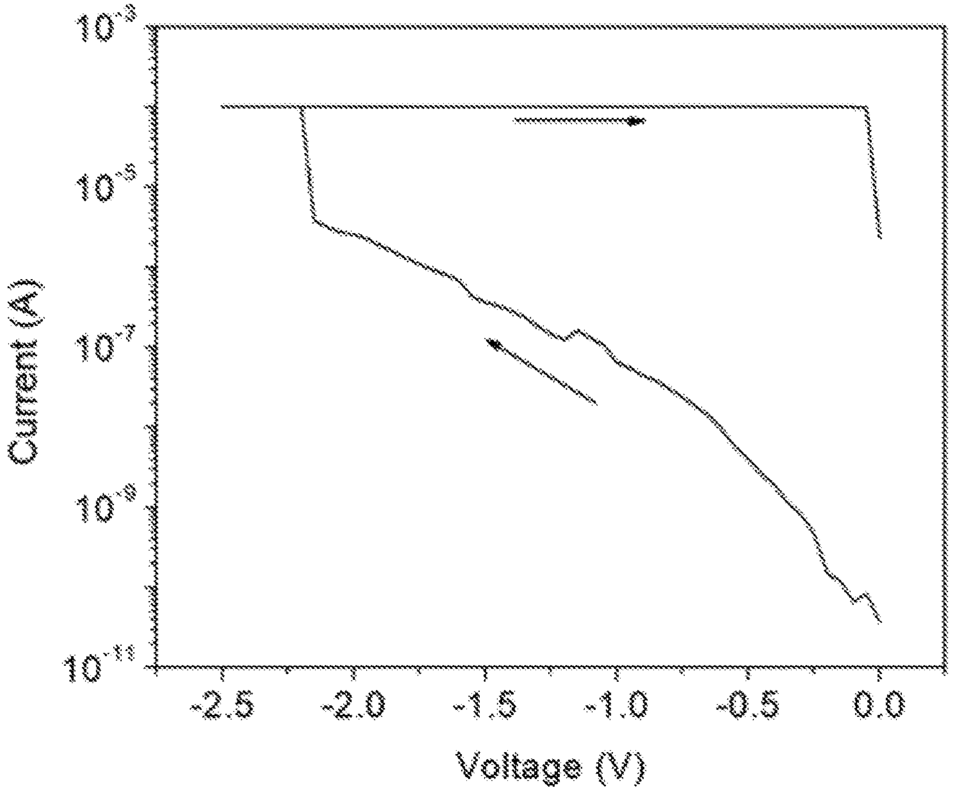
FIG. 4 is a graph illustrating an example characteristic of a forming process of a non-volatile memory device having a structure $W/Al_2O_3/Ta_2O_5/TaO_x/Ta/Pt$ according to an exemplary embodiment of the present disclosure.

FIG. 4 shows an example of the voltage-current characteristic of the electroforming process for one exemplary embodiment of the non-volatile memory device 100. The non-volatile memory device 100 of FIG. 4 has a $W/Al_2O_3/Ta_2O_5/TaO_x/Ta/Pt$ structure as shown in FIG. 1, in which the first electrode 111 is W, the second electrode 112 is Pt, the buffer layer 113 is $Al_2O_3$. The primary memory layer 114 includes a first active layer 114*a* of $Ta_2O_5$, a second active layer 114*b* of $TaO_x$, and a third active layer 114*c* of Ta. In this example, the Pt is the top electrode and the W is the bottom electrode. The electroforming process is performed by applying a negative voltage to the top electrode Pt, and the bottom electrode W is electrically grounded. During the electroforming process, the current increases with the voltage applied. When the applied voltage is greater than the electroforming voltage, the current increases to the limit or the compliance current value. In this example and as shown by the voltage-current curve, the electroforming voltage is around −2.15 V, and the compliance current is 1E-4 A. Through the electroforming process, the electrical resistance of the memory device is switched from an initial high resistance state (IRS) to a low resistance state (LRS), and conductive filaments or bridges are formed across the layers between the electrodes.

Figure 5:
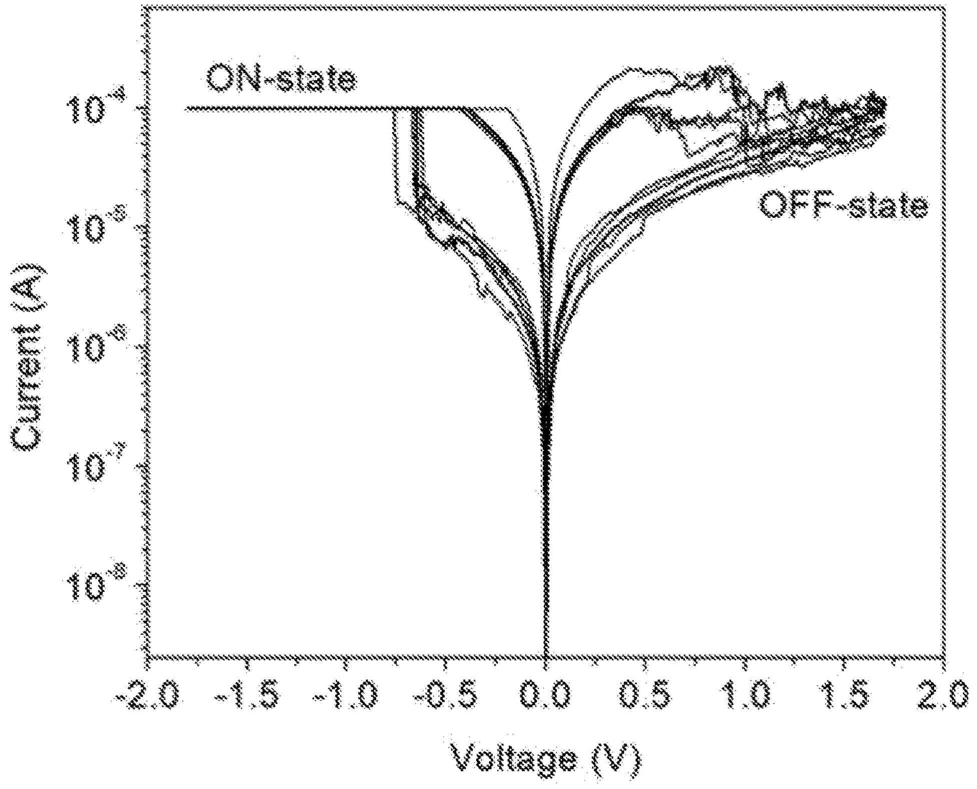
FIG. 5 is a graph illustrating an example characteristic of the voltage-current curves of a non-volatile memory device having a structure $W/Al_2O_3/Ta_2O_5/TaO_x/Ta/Pt$ according to an exemplary embodiment of the present disclosure.

FIG. 5 is a graph showing voltage-current curves of the non-volatile memory device 100 having a structure $W/Al_2O_3/Ta_2O_5/TaO_x/Ta/Pt$, after an electroforming process described with reference to FIG. 4. The voltage-current curves in FIG. 5 show a bipolar resistive switching characteristic. The non-volatile memory device 100 changes from an OFF-state to an ON-state in response to a negative set voltage being applied, and from an ON-state to an OFF-state in response to a positive reset voltage being applied. For the non-volatile memory device 100 of the present disclosure, both the set voltage and the reset voltage are well below −1.0 V and +1.0 V, respectively. The experimental results demonstrate that the non-volatile memory device 100 of the present disclosure can be used for low power applications. In operation, the diffusivity of oxygen ions/vacancies depends on the electrical field applied to the memory device 100 and the energy barrier. The non-volatile memory 100 of the present disclosure provides a lower energy barrier and decreases the electrical field required.

Figure 6:
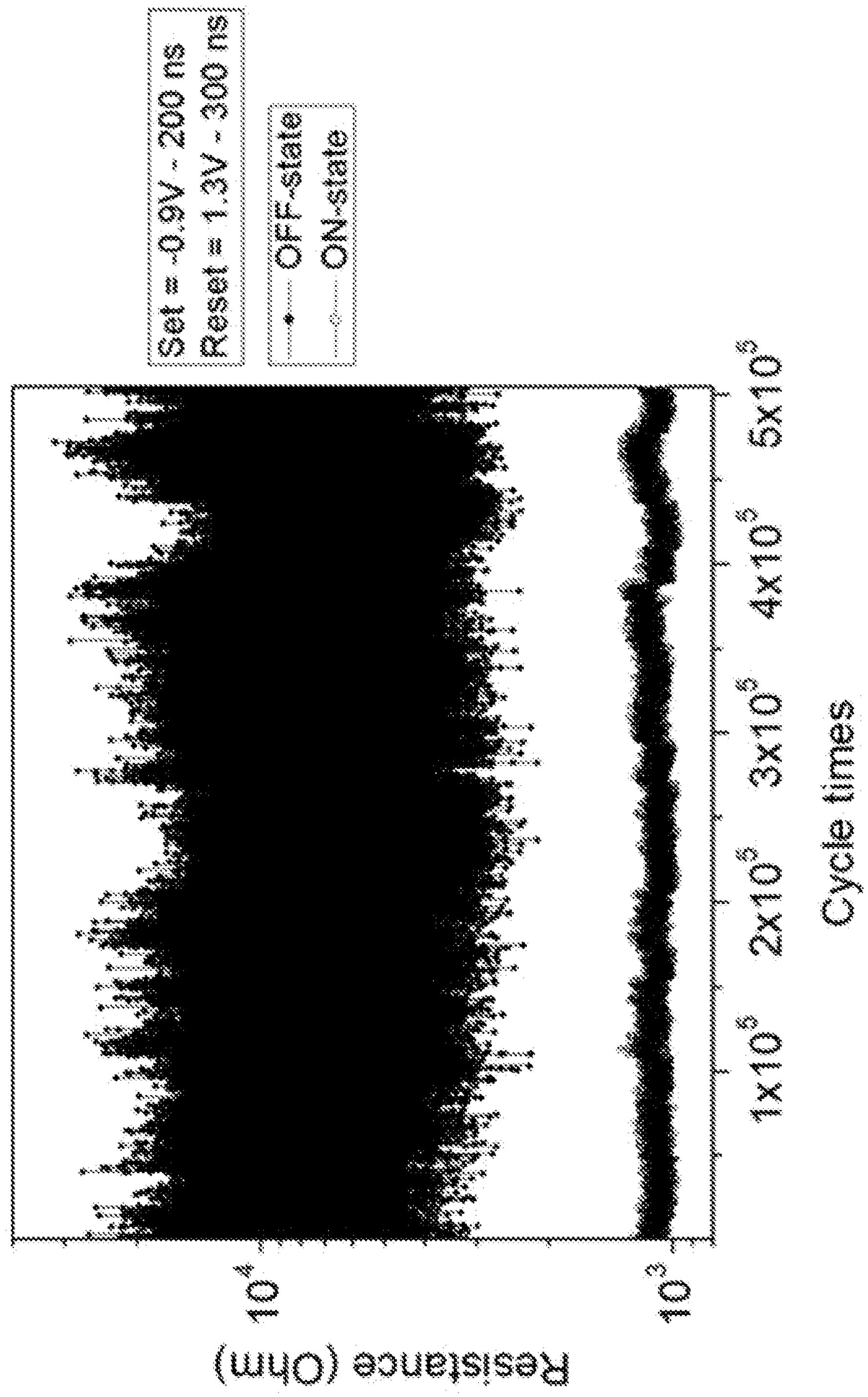
FIG. 6 is a graph illustrating an example characteristic of the endurance-test results of a non-volatile memory device having a structure $W/Al_2O_3/Ta_2O_5/TaO_x/Ta/Pt$ according to an exemplary embodiment of the present disclosure.

FIG. 6 shows the voltage pulse endurance test results for one exemplary embodiment of the non-volatile memory device 100 of FIGS. 4 and 5 (where the non-volatile memory device 100 has a structure of $W/Al_2O_3/Ta_2O_5/TaO_x/Ta/Pt$). The voltage pulse endurance test is used to determine endurance of a non-volatile memory device under high-speed switching operations. The voltage pulse endurance test in this example comprises a set voltage pulse to switch the non-volatile memory device from an OFF-state to an ON-state, in which the set voltage pulse has a height of −0.9 V and a pulse width of 200 ns, and a reset voltage pulse to switch the non-volatile memory device 100 from an ON-state to an OFF-state, in which the reset voltage pulse has a height of 1.3 V and a pulse width of 300 ns. The voltage pulse endurance test results in FIG. 6 show that the non-volatile memory device 100 of the present disclosure can be continuously operated for over 5E5 times, while maintaining a stable resistance characteristic.

Figure 7A:
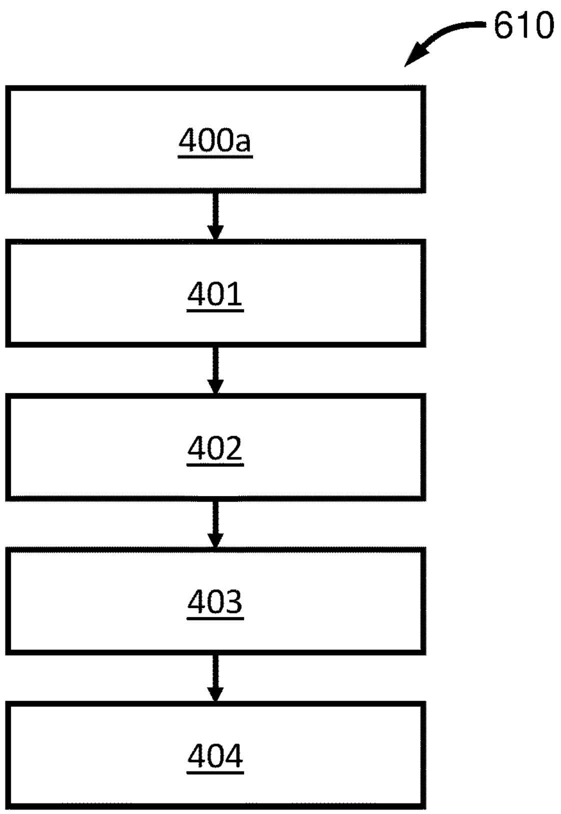
FIGS. 7A and 7B are schematic flow charts illustrating methods of forming non-volatile memory devices according to embodiments of the present disclosure.
Figure 7B:
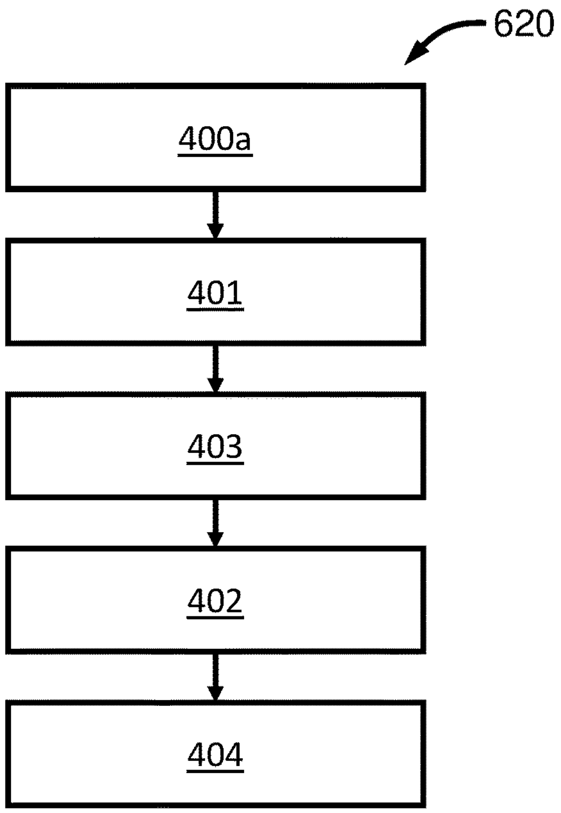

FIG. 7A is a flow chart illustrating a method 610 of fabricating a non-volatile memory device 100 according to an embodiment of the present disclosure. The method 610 includes providing a substrate (400*a*) and forming a bottom electrode on the substrate (401). The method 610 includes forming a buffer layer on the bottom electrode (402). The method 610 includes forming a primary memory layer (403) on the buffer layer, in which the primary memory layer is composed of multiple active layers with an oxygen gradient across the active layers. The method 610 includes forming a top electrode on the primary memory layer (404). FIG. 7B is a flow chart illustrating a method 620 of fabricating a non-volatile memory device 100 according to another embodiment of the present disclosure. The method 620 includes providing a substrate (400*a*), and forming a bottom electrode on the substrate (401). The method 620 includes forming a primary memory layer on the bottom electrode, in which the primary memory layer is composed of multiple active layers with an oxygen gradient across the active layers (403). The method 620 includes forming a buffer layer on the primary memory layer (402). The method 620 includes forming a top electrode on the primary memory layer (404). The oxygen gradient in the primary memory layer 114 may be obtained by different methods, as described below.

With reference to any of the embodiments of the method 610/620, the formation of each layer can be performed by selected physical techniques and/or chemical techniques, including but not limited to sputtering from a target, electron beam evaporation from a crucible, chemical vapor deposition from reactive precursors, etc. The film thickness of each electrode may be in a range from about 1 nanometer (nm) to about 100 nm for each of the first electrode and the second electrode 111/112. The film thickness of the buffer layer 113 may be in a range from about 0.5 nm to about 5 nm. The film thickness of each active layer of the primary memory layer 114 may be in a range from about 1 nm to about 10 nm. An electroforming process may be implemented to form conductive filaments or bridges within the layers between the electrodes (i.e., between the first electrode 111 and the second electrode 112). Decreasing the film thicknesses of the layers between the electrodes may result in a decrease of the electroforming voltage. Appropriate growth conditions, such as gas flow ratio, chamber pressure, chemical composition, and/or substrate temperature, may be chosen to achieve the structure desired for a specific layer. For example, when sputtering from a Hf target for the deposition of a $HfO_x$ film, the O/Hf ratio in the film (i.e., the oxygen concentration in the film) can be controlled by controlling the $O_2$/Ar flow ratio during the reactive sputtering process. In an example where sputtering from a Ta target is used to form a Ta oxide, the O/Ta ratio (i.e., the oxygen concentration in the Ta oxide) can be controllably determined by controlling the $O_2$/Ar flow ratio during the reactive sputtering process. In one example, the first active layer 114*a* is formed using a higher $O_2$/Ar flow ratio, and the second active layer 114*b* is formed using a lower $O_2$/Ar flow ratio (compared to the $O_2$/Ar flow ratio for forming the first active layer 114*a*). The third active layer 114*c* may be formed using an even lower $O_2$/Ar flow ratio than that used for forming the second active layer 114*b*.

Figure 8:
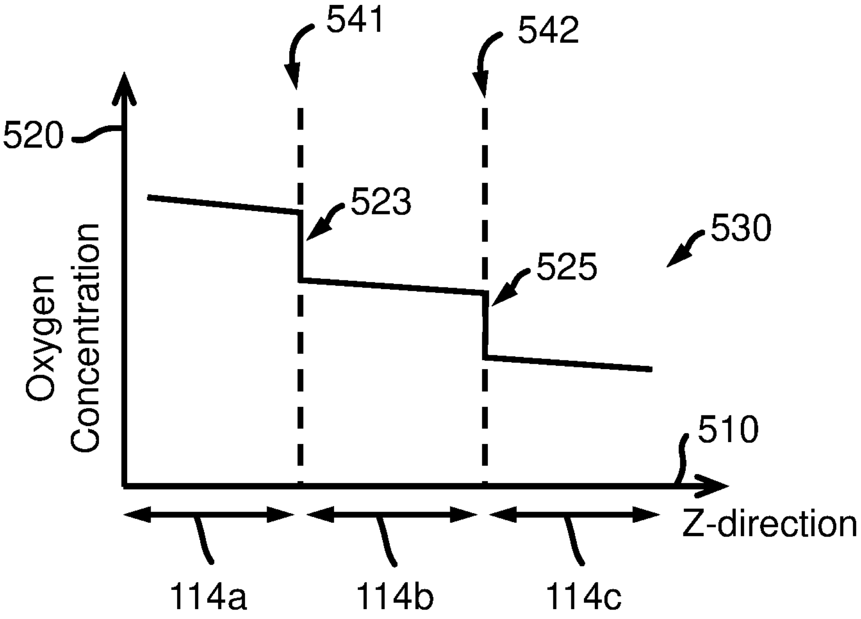
FIG. 8 is a graphical representation of an oxygen gradient in the primary memory layer according to embodiments of the present disclosure.

FIG. 8 graphically illustrates one example of the oxygen concentration 520 along a z-direction 510, in which the z-direction 510 is defined as extending from the first active layer 114*a* towards the third active layer 114*c*. In another aspect of the present disclosure, the non-volatile memory device 100 includes a primary memory layer 114 formed with two distinguishable interfaces 541, 542 therein. The first active layer 114*a* of the primary active layer 114 is formed with a uniform or substantially similar material composition throughout its film thickness in the z-direction 510. The first active layer 114*a* is formed with a uniform or substantially similar oxygen concentration throughout its film thickness in the z-direction 510. A first interface 541 is defined between the first active layer 114*a* and the second active layer 114*b*. The second active layer 114*b* of the primary memory layer 114 is bounded by the first interface 541 and the second interface 542. The second active layer 114*b* is formed with a uniform or substantially similar material composition throughout its film thickness in the z-direction 510. Alternatively described, the second active layer 114*b* is formed with a uniform or substantially similar oxygen concentration throughout its film thickness in the z-direction 510. The second interface 542 is defined between the second active layer 114*b* and the third active layer 114*c*. The third active layer 114*c* is formed with a uniform or substantially similar material composition throughout its film thickness in the z-direction 510. The third active layer 114*c* is formed with a uniform or substantially similar oxygen concentration throughout its film thickness in the z-direction 510.

As illustrated in FIG. 8, the non-volatile memory device 100 may be characterized in terms of an oxygen gradient 530, with a highest oxygen concentration associated with the first active layer 114*a* and a lowest oxygen concentration associated with the third active layer 114*c*. The oxygen concentration associated with the second active layer 114*b* is lower than or at most about equal to the oxygen concentration associated with the first active layer 114*a*. The oxygen concentration associated with the third active layer 114*c* is lower than or at most about equal to the oxygen concentration associated with the second active layer 114*c*. An oxygen concentration 523 may be associated with the first interface 541 (i.e., the interface between the first active layer 114*a* and the second active layer 114*b*), in which the oxygen concentration 523 is lower than an oxygen concentration of the first active layer 114*a* and higher than an oxygen concentration of the second active layer 114*b*. An oxygen concentration 525 may be associated with the second interface 542 (i.e., the interface between the second active layer 114*b* and the third active layer 114*c*), in which the oxygen concentration 525 is lower than an oxygen concentration of the second active layer 114*b* and higher than an oxygen concentration of the third active layer 114*c*. As illustrated, the oxygen gradient 530 may be described in stages (demarcated generally by the first interface 541 and the second interface 542), i.e., changing gradually from the first active layer to the third active layer.

In another aspect, the non-volatile memory device 100 is formed with three active layers in the primary memory layer 114, in which each of the three active layers is formed with a different oxygen concentration. The non-volatile memory device 100 includes a buffer layer 113 that is immediately adjacent and connected to the first active layer 114*a*, i.e., the buffer layer 113 is directly connected to the active layer having the highest oxygen concentration. Of the three active layers in the primary memory layer 114, the first active layer 114*a* is defined as the layer formed with the highest concentration of oxygen, and the third active layer 114*c* is defined as the layer formed with the lowest concentration of oxygen. The buffer layer 113 is immediately adjacent and directly connected to the first active layer 114*a* on one side, and at the same time, the buffer layer 113 is immediately and directly connected to the first electrode layer 111 on another side. The first active layer 114*a* is directly connected to the buffer layer 113 on one side and directly connected to the second active layer 114*b* on another side. The second active layer 114*b* is directly connected to the first active layer 114*a* on one side and directly connected to the third active layer 114*c* on another side. The third active layer 114*c* is directly connected to the second active layer 114*b* on one side and directly connected to the second electrode layer 112 on another side.

In various embodiments of the non-volatile memory device 100, such as the examples illustrated by FIGS. 9A to 9D, the first electrode layer 111 may be formed of any of the following: W, Al, Cu, Mo, Co, Ni, Fe, Pt, Pd, Au, Ir, Ru, Rh, TiN, TiW, TaN, etc. The second electrode layer 112 may be formed of any of the following: Pt, Pd, Au, Ir, Ru, Rh, TiN, TaN, TiW, etc.

In each of the various embodiments illustrated by FIGS. 9A to 9D, the non-volatile memory device 100 includes a buffer layer 113 disposed immediately adjacent to and in direct contact (i.e., immediately adjacent and connected) with the first active layer 114*a* of a metal oxide of stoichiometric or near stoichiometric composition. The buffer layer 113 and the primary memory layer 114 are disposed between the first electrode layer 111 and the second electrode layer 112. Each of the buffer layer 113 and the primary memory layer 114 is configured to be immediately adjacent and/or in physical contact with different ones of the first electrode layer 111 and the second electrode layer 112. The primary layer 114 includes the first active layer 114*a*, the second active layer 114*b*, and the third active layer 114*c*. The first active layer 114*a* is configured to be immediately adjacent to and/or in physical contact with both the buffer layer 113 and the second active layer 114*b*. If the buffer layer 113 is configured to be immediately adjacent to and/or in direct physical contact with the first electrode layer 111, the third active layer 114*c* is configured to be immediately adjacent to and/or in physical contact with both the second active layer 114*b* and the second electrode layer 112. In each of the various examples described below with reference to FIGS. 9A to 9D merely to aid understanding and not to be limiting, the materials selected for each combination of the first active layer 114*a*, the second active layer 114*b*, and the third active layer 114*c* are such that the primary memory layer 114 is characterized by an oxygen gradient. The oxygen gradient includes a highest oxygen concentration at the first active layer 114*a* and a lowest oxygen concentration at the third active layer 114*c*, and an intermediate oxygen concentration at the second active layer 114*b*.

In some embodiments, non-volatile memory device 100 is configured such that the buffer layer 113 may be any one or a combination of more than one oxide selected from the following: $AlO_x$, $SiO_x$, $MgO_x$, $CaO_x$, and $HfSiO_x$. The buffer layer 113 may be formed of a first metal oxide which includes at least one of the following: $AlO_x$, $SiO_x$, $MgO_x$, $CaO_x$, and $HfSiO_x$, or any combination thereof. The first metal oxide may have a stoichiometric or near stoichiometric composition. The buffer layer 113 may be configured to provide a potential barrier between the first electrode layer 111 and the primary memory layer 114. The buffer layer 113 may be configured to be more stable than the first active layer 114*a*. The first metal oxide is selected to have an interatomic bonding energy greater than that of the first active layer 114*a*. That is, the first metal oxide and the second metal oxides are selected such that the first metal oxide has a band gap greater than that of the second metal oxide.

Figure 9A:
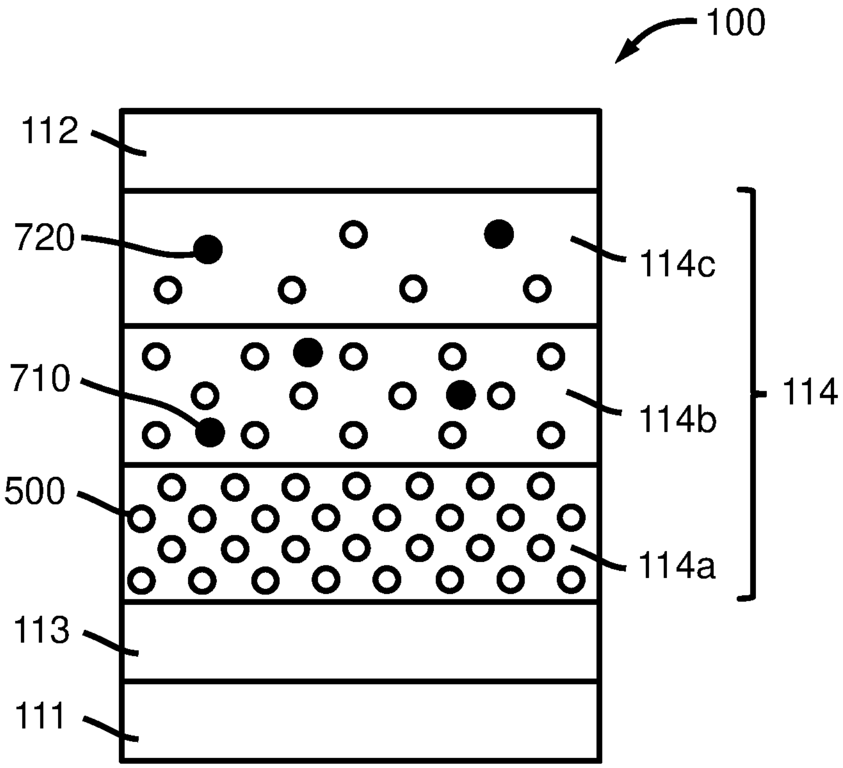
FIGS. 9A to 9D are schematic diagrams illustrating various embodiments of the non-volatile memory device according to the present disclosure.

Referring to FIG. 9A, the first active layer 114*a* may be formed of a second metal oxide, in which the second oxide includes one of Ta oxide, Hf oxide, Zr oxide, Ti oxide, La oxide, or any combination thereof. The second metal oxide is preferably characterized by a stoichiometric or near stoichiometric composition. The second active layer 114*b* may be formed of a third metal oxide, in which the third metal oxide is an oxide from the same oxide group as the second metal oxide. The second active layer 114*b* may include a first dopant, in which the first dopant 710 includes a metal element that is different from the metal of the second metal oxide. In other words, the first dopant may be a metal different from any metal element forming the second metal oxide or present in the first active layer. The third active layer 114*c* may be formed of a fourth metal oxide, in which the fourth metal oxide is an oxide from the same oxide group as the third metal oxide. The third active layer 114*c* may include a second dopant 720, in which the second dopant includes a metal element that is different from the metal of the second metal oxide. The second dopant may be the same or different from the first dopant. In other words, the second dopant may be a metal different from any metal element forming the third metal oxide or present in the second active layer. If the third metal oxide is doped with a first dopant, the second dopant may be doped with a second dopant that is the same as the first dopant or different from the first dopant. In other words, the second dopant may be a metal different from any metal element forming the second metal oxide if the third metal oxide is doped, or if the third metal oxide is undoped, the second dopant may be a metal different from any metal element forming the third metal oxide.

For example, the buffer layer 113 may be formed of a first metal oxide including $Al_2O_3$, and the first active layer 114*a* may be formed of a second metal oxide including $Ta_2O_x$ in which $4.5 \leq x \leq 5$. The second active layer 114*b* may be a third metal oxide doped with a first dopant. The second active layer 114*b* may include hafnium-doped tantalum oxide $TaO_y$, in which $1 \leq y \leq 2.2$. The third active layer 114*c* may be a fourth metal oxide doped with a second dopant. The third active layer 114*c* may include zirconium-doped tantalum oxide $TaO_z$, in which $0 < z \leq 0.5$.

Still referring to FIG. 9A, in another example, the non-volatile memory device 100 may be configured with the buffer layer 113 of a first metal oxide, in which the first metal oxide may include $AlO_x$, $SiO_x$, $MgO_x$, $CaO_x$, $HfSiO_x$, and/or any combination thereof. The first active layer 114*a*, the second active layer 114*b*, and the third active layer 114*c* are each an oxide of the same oxide group. The second active layer 114*b* is doped with a metal M, and the third active layer 114*c* is doped with a metal N, in which M and N are the same or different metals from one another. M and N are selected such that the M-doped third metal oxide has a lower oxygen concentration than the second metal oxide, and such that the M-doped third metal oxide has a higher oxygen concentration than N-doped fourth metal oxide.

For example, the non-volatile memory device 100 may be configured with the buffer layer 113 of a first metal oxide, in which the first metal oxide may include $AlO_x$, $SiO_x$, $MgO_x$, $CaO_x$, $HfSiO_x$, and/or any combination thereof. The first active layer 114*a* is formed immediately adjacent to and in direct contact with (connected to) the buffer layer 113. The first active layer 114*a*, the second active layer 114*b*, and the third active layer 114*c* may each be an oxide of the same oxide group. The buffer layer 113 may be $SiO_2$, the first active layer 114*a* may be $HfO_2$, the second active layer 114*b* may be M-doped $HfO_x$, and the third active layer 114*c* may be N-doped $HfO_x$, in which $0 < x < 2$, and in which neither M nor N includes hafnium. In the present disclosure, the M-doped $HfO_x$ and the N-doped $HfO_x$ are characterized by different oxygen concentrations respectively.

In another example, the buffer layer 113 may include at least one of $AlO_x$, $SiO_x$, $MgO_x$, $CaO_x$, $HfSiO_x$, and/or any combination thereof. The first active layer 114*a* is formed immediately adjacent to and in direct contact with the buffer layer 113. The first active layer 114*a*, the second active layer 114*b*, and the third active layer 114*c* may each be an oxide of the same oxide group. The first active layer 114*a* may be $Ta_2O_5$, the second active layer **114*b*** may be M-doped $TaO_2$, and the third active layer may be N-doped TaO, in which neither the first dopant M nor the second dopant N includes tantalum.

Figure 9B:
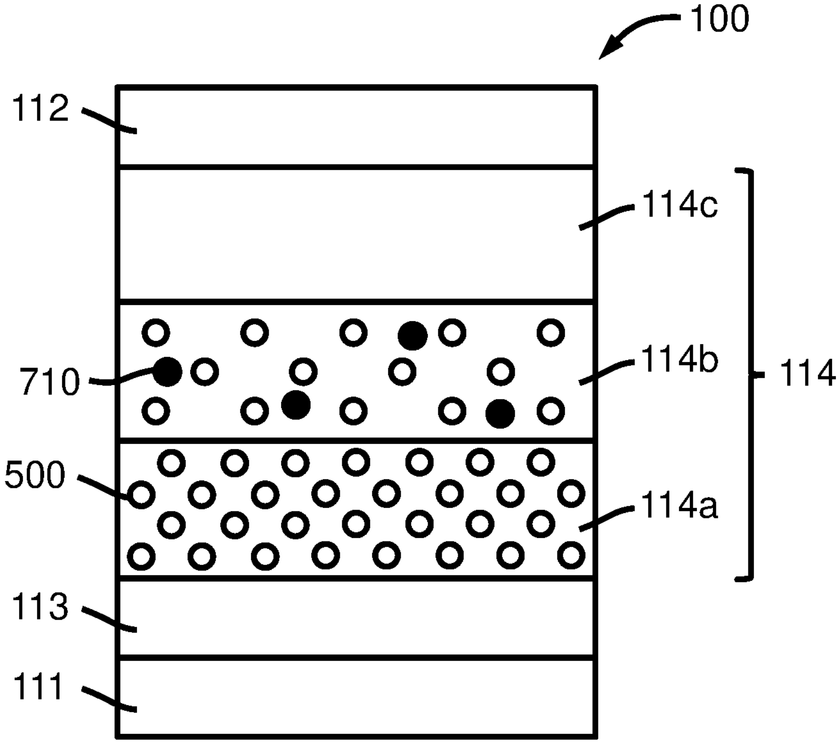

Referring to FIG. 9B, in another example, the non-volatile memory device 100 may be configured with the buffer layer 113 of a first metal oxide, in which the first metal oxide may include $AlO_x$, $SiO_x$, $MgO_x$, $CaO_x$, $HfSiO_x$, and/or any combination thereof. Each of the first active layer **114*a* and the second active layer 114*b* is formed as an oxide of the same oxide group. The second active layer 114*b* is doped with a metal M, in which M is a different metal from the metal present in the first active layer 114*a*. The second active layer 114*b* is doped with M such that the M-doped third metal oxide has a lower oxygen concentration than the second metal oxide. Alternatively, the third active layer 114*c* may be an active metal selected from the group consisting of Ta, Ti, Hf, Zr, Co, Ni, and Fe. In some embodiments, the third active layer 114*c* may be an active metal selected from non-magnetic metals, e.g., the active metal of the third active layer 114*c* may be selected from the group consisting of Ta, Ti, Hf, and Zr. In some embodiments, the third active layer 114*c*** may be selected from the group consisting of Co, Ni, Fe, and an alloy of any two or more of Co, Ni, and Fe.

In one example, the buffer layer 113 may be aluminum oxide $Al_2O_3$. The first active layer **114*a* may be $Ta_2O_5$, in which $4.5 \leq x \leq 5$. The second active layer 114*b* may be hafnium-doped $TaO_y$, in which $1 \leq y \leq 2.2$. The third active layer 114*c*** may be the active metal tantalum Ta.

In another example, the memory device 100 may include layers of $AlO_x/Ta_2O_5$/doped-$TaO_2$/Ta, where the aluminum oxide is the buffer layer 113, and the primary memory layer 114 is a tri-layer structure of $Ta_2O_5$/doped-$TaO_2$/Ta.

Figure 9C:
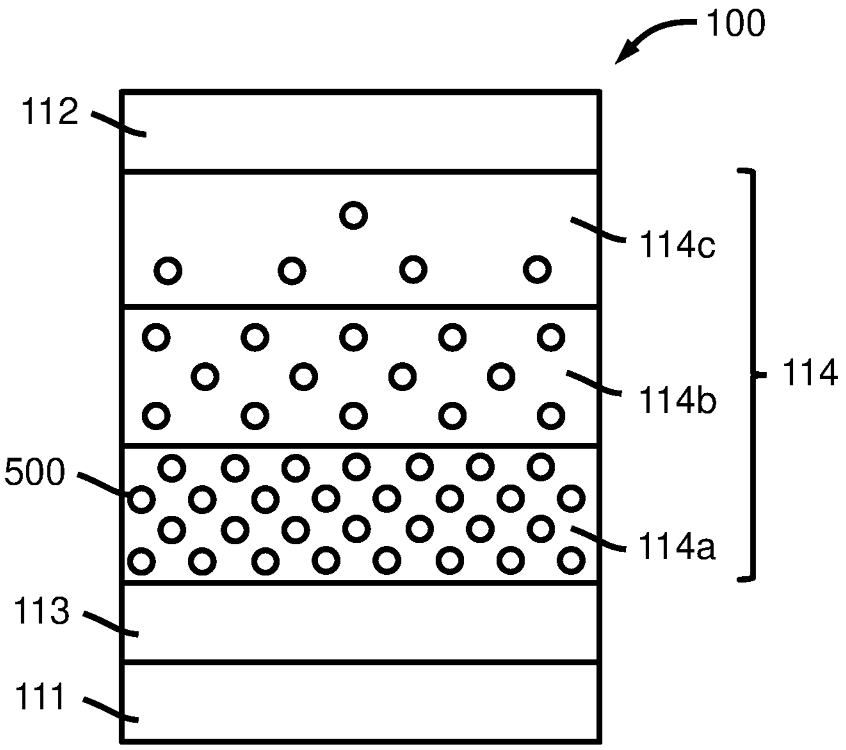

Referring to FIG. 9C, in yet another example, the non-volatile memory device 100 may be configured with the buffer layer 113 of a first metal oxide, in which the first metal oxide may include $AlO_x$, $SiO_x$, $MgO_x$, $CaO_x$, $HfSiO_x$, and/or any combination thereof. The first active layer **114*a* is formed of the second metal oxide. The second metal oxide includes one of Ta oxide, Hf oxide, Zr oxide, Ti oxide, La oxide, or a combination thereof. The second active layer 114*b* is formed of the third metal oxide. The third metal oxide is one selected from the group consisting of Ta oxide, Hf oxide, Zr oxide, Ti oxide, La oxide, or a combination therefore, in which additionally the third metal oxide and the second metal oxide are different oxide groups or are oxides of metals from different groups of the periodic table. The third active layer 114*c*** is formed of the fourth metal oxide. The fourth metal oxide is one selected from the group consisting of Ta oxide, Hf oxide, Zr oxide, Ti oxide, La oxide, or a combination therefore, in which additionally the fourth metal oxide and the third metal oxides are different oxide groups or are oxides of metals from different groups of the periodic table.

In one example, the buffer layer 113 may include $SiO_x$ as the first metal oxide, the first active layer **114*a* may include $Ta_2O_5$ as the second metal oxide, the second active layer 114*b* may include (undoped) $TiO_x$ as the third metal oxide, and the third active layer 114*c*** may include (undoped) TaO, as the fourth metal oxide.

Figure 9D:
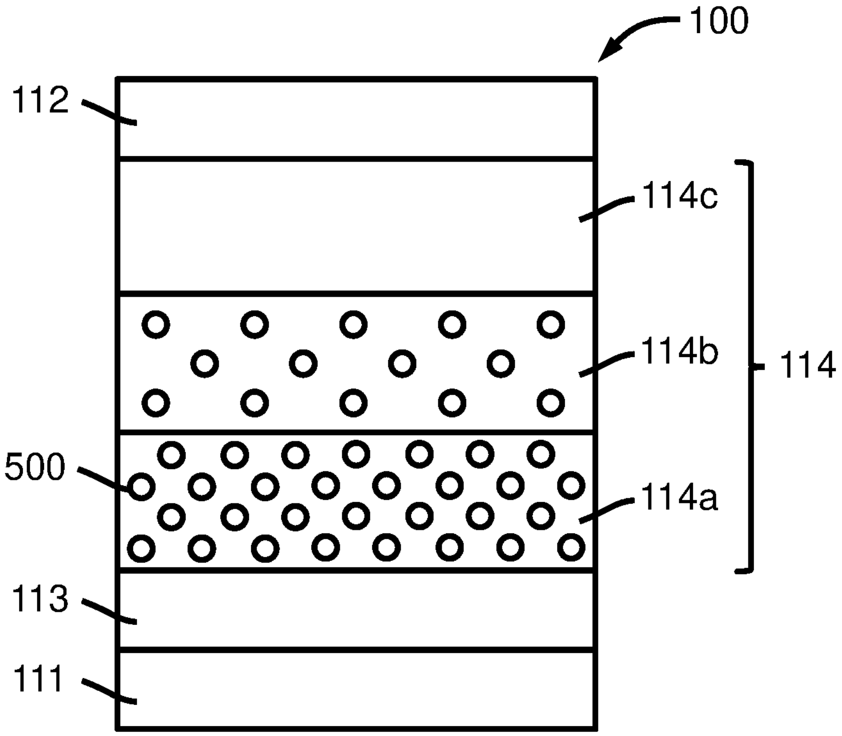

Referring to FIG. 9D, in yet another example, the non-volatile memory device 100 may be configured with the buffer layer 113 of a first metal oxide, in which the first metal oxide may include $AlO_x$, $SiO_x$, $MgO_x$, $CaO_x$, $HfSiO_x$, and/or any combination thereof. The first active layer **114*a* is formed of the second metal oxide. The second metal oxide includes one of Ta oxide, Hf oxide, Zr oxide, Ti oxide, La oxide, or a combination thereof. The second active layer 114*b* is formed of the third metal oxide. The third metal oxide is one selected from the group consisting of Ta oxide, Hf oxide, Zr oxide, Ti oxide, La oxide, or a combination thereof, in which additionally the third metal oxide and the second metal oxide are different oxide groups or are oxides of metals from different groups of the periodic table. The third active layer 114*c*** is an active metal. The active metal may be one selected from the group consisting of Ta, Hf, Zr, Ti, Co, Ni, and Fe.

In one example, the buffer layer 113 may be $HfSiO_x$, the first active layer **114*a* immediately adjacent and in physical contact with the buffer layer 113 may be $Ta_2O_5$, the second active layer 114*b* may be an (undoped) third metal oxide $ZrO_x$, and the third active layer 114*c*** may be the active metal Ti.

In another example, the buffer layer 113 may be the first metal oxide $MgO_x$, and the first active layer **114*a* may be the second metal oxide $Ta_2O_y$, where $4.5 \leq y \leq 5$. The second active layer 114*b* may be an (undoped) third metal oxide $LaO_z$, and the third active layer 114*c*** may be the active metal Hf.

It is found that the non-volatile memories configured according to the embodiments of the present disclosure can maintain a relatively stable staged or gradual oxygen gradient across the primary memory layer with relatively thin film thicknesses. The buffer layer may be configured with a film thickness (in the z-direction 510) in a range from about 0.5 nm inclusive to about 5 nm inclusive. Each of the first active layer, the second active layer, and the third active layer may be configured with a respective film thickness (in the z-direction 510) in a range from about 1 nm inclusive to about 10 nm inclusive. In the present disclosure, reference to a range from 1 nm to 10 nm (for example) will be understood to include 1 nm and 10 nm. It will further be understood that reference to a numerical value includes a range about said numerical value according to the typical industrially achievable tolerance in the field.

Figure 10:
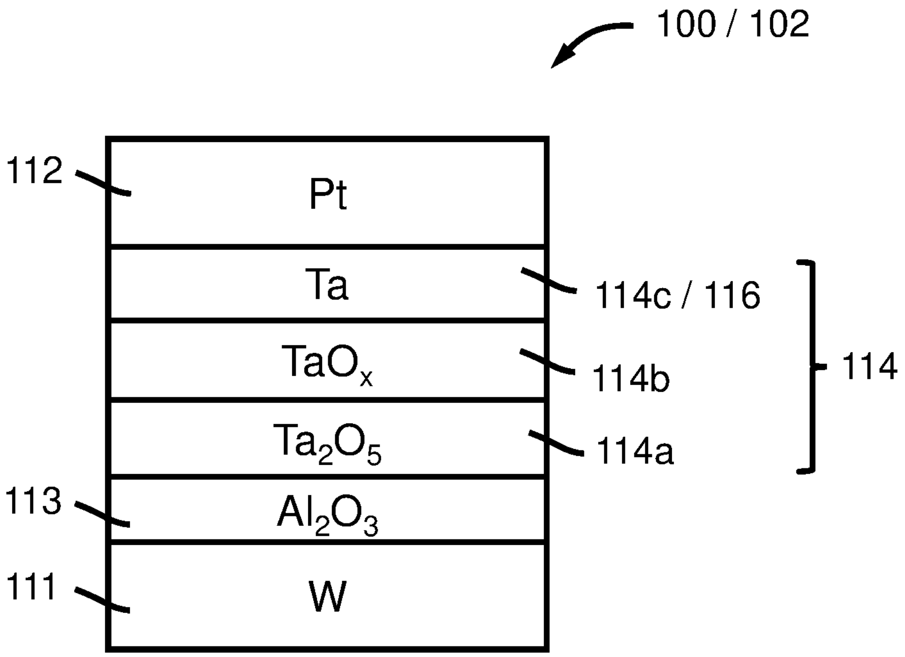
FIG. 10 is a schematic diagram illustrating one example of the non-volatile memory device with a non-magnetic third active layer.
Figure 11:
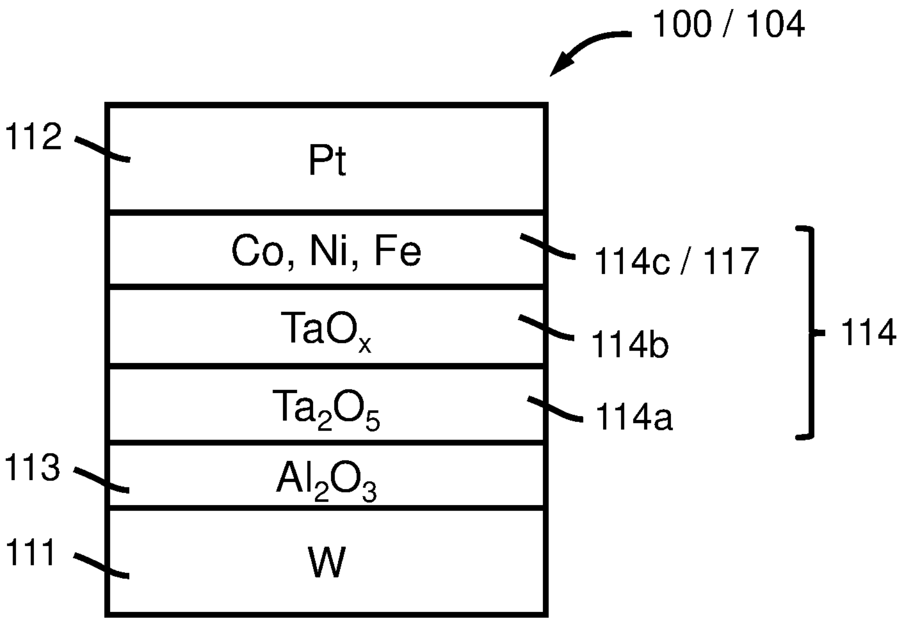
FIG. 11 is a schematic diagram illustrating an example of the non-volatile memory device with a magnetic third active layer.

Various embodiments of the present disclosure can find applications in a broad range of non-volatile memories. FIG. 10 is a schematic diagram illustrating an example of the non-volatile memory device 100 suitable for use as a resistive random-access memory 102. The non-volatile memory device 100 may be configured with a structure $W/Al_2O_3/Ta_2O_5/TaO_x$/Ta/Pt, in which the second active layer $TaO_x$ **114*b* is doped with the first dopant 710. In this example, the third active layer 114*c* is not magnetic 116, i.e., the third active layer does not include one or more magnetic elements and/or related alloys and/or compounds thereof. The first dopant 710 may be at least one selected from the group consisting of Al, Hf, Ti, Zr, Nb, and Ru. In examples where the third active layer 114*c* includes TaO, and where the third active layer 114*c* is doped with the second dopant 720, the second dopant 720 may at least one selected from the group consisting of Al, Hf, Ti, Zr, Nb, and Ru. Various embodiments of the present disclosure can also be used for the purpose of magnetic random-access memories 104. For example, as shown in the schematic diagram of FIG. 11, the non-volatile memory device 100 may be configured with a third active layer 114*c* that is a magnetic layer 117. The third active layer 114*c* may include a magnetic element, such as but not limited to: Co, Ni, and Fe. The third active layer 114*c* may alternatively include one or more alloys and/or compounds of one or more magnetic elements (e.g., Co, Ni, and/or Fe). The magnetic properties of this third active layer 114*c* may be manipulated through applying different voltage biases. In one example, the non-volatile memory device 100** is configured with a structure $W/Al_2O_3/Ta_2O_5/TaO/Co/Pt$, in which the second active layer $TaO_x$ 114*b* is doped with the first dopant 710. In another example the non-volatile memory device 100 may be configured with a structure $W/Al_2O_3/Ta_2O_5/TaO_x/Ni/Pt$, in which the second active layer $TaO_x$ 114*b* is doped with the first dopant 710. In yet another example, the non-volatile memory device 100 may be configured with a structure $W/Al_2O_3/Ta_2O_5/TaO_x/CoFe/Pt$, in which the second active layer $TaO_x$ 114*b* is doped with the first dopant 710. In these examples, the first dopant may be a metal that is different from any metal present in the first active layer $Ta_2O_5$ 114*a*. As described above, various embodiments of the present disclosure can be used for voltage-controlled magnetic random-access memory devices.

All examples described herein, whether of apparatus, methods, materials, or products, are presented for the purpose of illustration and to aid understanding, and are not intended to be limiting or exhaustive. Various changes and modifications may be made by one of ordinary skill in the art without departing from the scope of the invention as claimed.

The invention claimed is:

1. A non-volatile memory device, comprising:
- a buffer layer of a first metal oxide; and
- a primary memory layer having:
  - a first active layer of a second metal oxide, the first active layer being immediately adjacent and connected to the buffer layer;
  - a second active layer of a third metal oxide; and
  - a third active layer of a fourth metal oxide, the second active layer being disposed between the first active layer and the third active layer, wherein the primary memory layer is characterized by an oxygen gradient, and wherein a highest oxygen concentration is associated with the first active layer, and wherein a lowest oxygen concentration is associated with the third active layer;
  - wherein the third metal oxide further comprises a first dopant, the first dopant being a metal different from any metal element forming the second metal oxide;
  - wherein the fourth metal oxide further comprises a second dopant, the second dopant being a metal different from any metal element forming the second metal oxide; and
  - wherein the first dopant and the second dopant are selected such that the doped third metal oxide has a higher oxygen concentration than the doped fourth metal oxide.

2. The non-volatile memory device as set forth in claim 1, wherein each of the first active layer, the second active layer, and the third active layer is associated with a respective work function, and wherein the respective work function decreases from the first active layer to the second active layer, and wherein the respective work function decreases from the second active layer to the third active layer.

3. The non-volatile memory device as set forth in claim 1, wherein the first metal oxide is characterized by a stoichiometric or near stoichiometric composition; and wherein the first metal oxide comprises one of $AlO_x$, $SiO_x$, $MgO_x$, $CaO_x$, $HfSiO_x$, or any combination thereof.

4. The non-volatile memory device as set forth in claim 1, wherein the second metal oxide comprises one of Ta oxide, Hf oxide, Zr oxide, Ti oxide, La oxide, or any combination thereof, and wherein the second metal oxide is characterized by a stoichiometric or near stoichiometric composition.

5. The non-volatile memory device as set forth in claim 1, wherein the third metal oxide comprises one of Ta oxide, Hf oxide, Zr oxide, Ti oxide, La oxide, or any combination thereof.

6. The non-volatile memory device as set forth in claim 5, wherein the second metal oxide and the third metal oxide are of a same group.

7. The non-volatile memory device as set forth in claim 1, wherein the fourth metal oxide comprises one of Ta oxide, Hf oxide, Zr oxide, Ti oxide, La oxide, or any combination thereof.

8. The non-volatile memory device as set forth in claim 7, wherein the third metal oxide and the fourth metal oxide are of a same group.

9. The non-volatile memory device as set forth in claim 7, wherein the second dopant is a metal that is same as a first dopant.

10. The non-volatile memory device as set forth in claim 7, wherein the second dopant is a metal that is different from a first dopant.

11. The non-volatile memory device as set forth in claim 1, wherein the buffer layer comprises $Al_2O_3$, and wherein the first active layer comprises $Ta_2O_x$ in which $4.5 \leq x \leq 5$.

12. The non-volatile memory device as set forth in claim 11, wherein the second active layer comprises $TaO_y$ in which $1 \leq y \leq 2.2$, and wherein the the first dopant is a metal different from any metal present in the first active layer.

13. The non-volatile memory device as set forth in claim 12, wherein the third active layer comprises $TaO_z$ in which $0 < z \leq 0.5$, and wherein the second dopant is a metal different from any metal present in the first active layer.

14. The non-volatile memory device as set forth in claim 1, further comprises a first electrode layer and a second electrode layer, wherein the buffer layer and the primary memory layer are disposed between the first electrode layer and the second electrode layer.

15. The non-volatile memory device as set forth in claim 1, wherein each of the first active layer, the second active layer, and the third active layer has a film thickness in a range from 1 nanometer to 10 nanometers.

16. The non-volatile memory device as set forth in claim 1, wherein the buffer layer has a film thickness in a range from 0.5 nanometer to 5 nanometers.

17. The non-volatile memory device as set forth in claim 12, wherein the first dopant is at least one selected from the group consisting of: Al, Hf, Ti, Zr, Nb, and Ru.

18. The non-volatile memory device as set forth in claim 13, wherein the second dopant is at least one selected from the group consisting of: Al, Hf, Ti, Zr, Nb, and Ru.

19. A non-volatile memory device, comprising:
- a first electrode layer;
- a second electrode layer;
- a buffer layer disposed between the first electrode and the second electrode, the buffer layer formed of a first metal oxide; and
- a primary memory layer comprising three active layers disposed between the buffer layer and the second electrode, the first active layer is formed of a second metal oxide and physically connected to the buffer layer, the second active layer is formed of a third metal oxide, and the third active layer is formed of a fourth metal oxide and physically connected to the second electrode; wherein the first active layer having a high oxygen concentration, the second active layer having a lower oxygen concentration than the first active layer, and the third active layer having a lower oxygen concentration than the second active layer, an oxygen concentration decreasing in stages or gradually in a direction from the first active layer to the third active layer;

wherein the third metal oxide further comprises a first dopant, the first dopant being a metal different from any metal element forming the second metal oxide;

wherein the fourth metal oxide further comprises a second dopant, the second dopant being a metal different from any metal element forming the second metal oxide; and wherein the first dopant and the second dopant are selected such that the doped third metal oxide has a higher oxygen concentration than the doped fourth metal oxide.

* * * * *